United States Patent
Aiba et al.

(10) Patent No.: US 11,285,722 B2
(45) Date of Patent: Mar. 29, 2022

(54) INKJET HEAD AND PIEZOELECTRIC ACTUATOR

(71) Applicant: Brother Kogyo Kabushiki Kaisha, Aichi-Ken (JP)

(72) Inventors: Takashi Aiba, Nagoya (JP); Keiji Kura, Chita-gun (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 17/216,028

(22) Filed: Mar. 29, 2021

(65) Prior Publication Data
US 2021/0300041 A1   Sep. 30, 2021

(30) Foreign Application Priority Data

Mar. 30, 2020   (JP) .............................. JP2020-059595

(51) Int. Cl.
*B41J 2/14*   (2006.01)
*H01L 41/09*   (2006.01)
*H01L 41/047*   (2006.01)

(52) U.S. Cl.
CPC ...... *B41J 2/14233* (2013.01); *H01L 41/0477* (2013.01); *H01L 41/0973* (2013.01); *B41J 2002/14467* (2013.01); *B41J 2002/14491* (2013.01)

(58) Field of Classification Search
None
See application file for complete search history.

(56) References Cited

U.S. PATENT DOCUMENTS

2009/0244205 A1* 10/2009 Kura .................... B41J 2/14233
347/68

FOREIGN PATENT DOCUMENTS

JP   2018-34474 A   3/2018

* cited by examiner

*Primary Examiner* — Erica S Lin
(74) *Attorney, Agent, or Firm* — Banner & Witcoff, Ltd.

(57) ABSTRACT

An inkjet head includes a channel unit and a piezoelectric actuator. The piezoelectric actuator includes a first piezoelectric plate, a first electrode, a second piezoelectric plate, a second electrode, and a conductive member. The first piezoelectric plate includes a first surface. The first electrode is disposed on the first surface, and includes a first extending portion. The second piezoelectric plate includes a second surface. The second electrode is disposed on the second surface, and includes a second extending portion. The conductive member includes a first conductive portion and a second conductive portion. The first conductive portion is disposed on the first surface. The second conductive portion is disposed on the second surface. The conductive portion covers, in a first direction, a spacing that is located between the first extending portion and the second extending portion in a second direction.

11 Claims, 13 Drawing Sheets

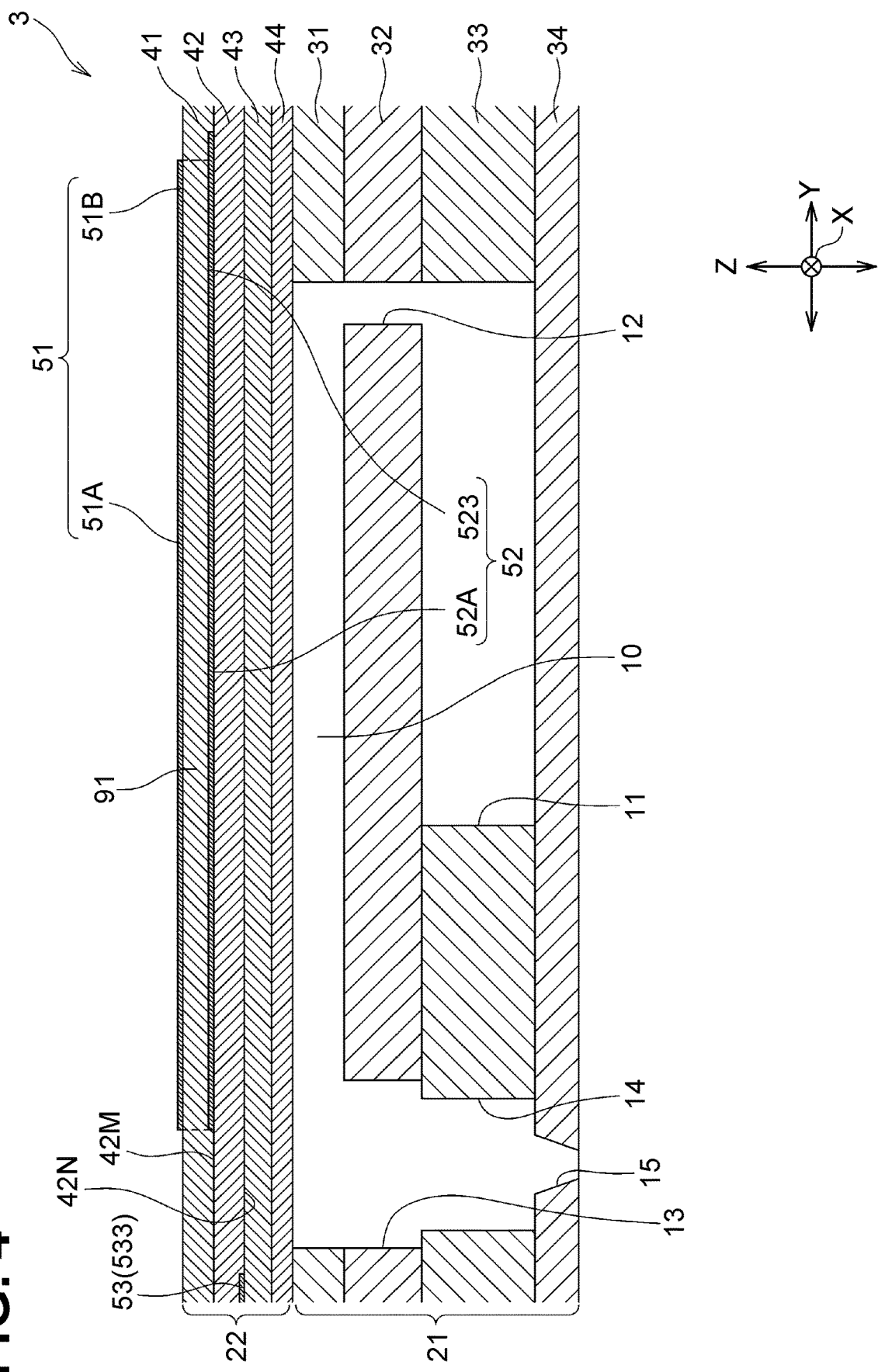

FIG. 5A
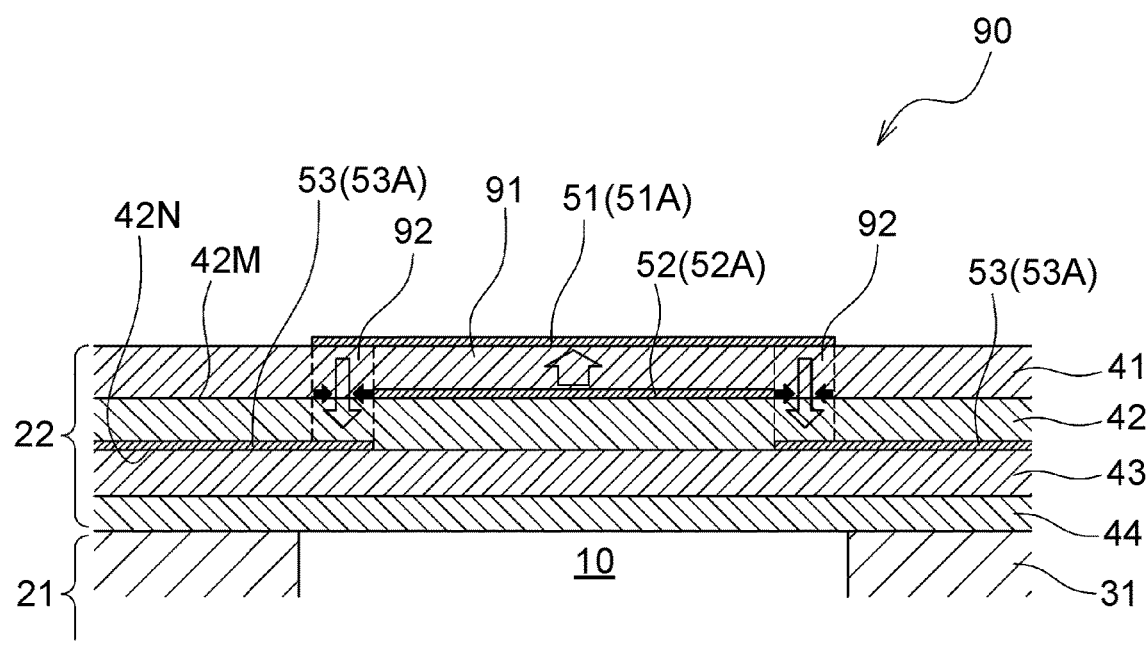
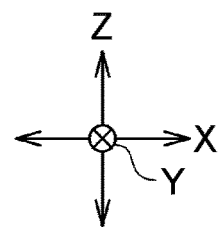

INKJET HEAD AND PIEZOELECTRIC ACTUATOR

CROSS-REFERENCE TO RELATED APPLICATION

This application claims priority from Japanese Patent Application No. 2020-059595 filed on Mar. 30, 2020, the content of which is incorporated herein by reference in its entirety.

TECHNICAL FIELD

The present disclosure relates to a piezoelectric actuator including one or more piezoelectric plates.

BACKGROUND

A known piezoelectric actuator includes one or more piezoelectric plates. The one or more piezoelectric plates includes an upper plate, an intermediate plate, and a lower plate. The piezoelectric actuator includes a high potential electrode disposed on the intermediate plate, and a low potential electrode disposed on the lower plate. The high potential electrode includes a connecting portion extending in a left-right direction. The low potential electrode includes a connecting portion extending in the left-right direction. A spacing is arranged between the two connecting portions in the left-right direction. A width of each of the two connecting portions is wide enough such that a large current may flow in the high potential electrode and the low potential electrode.

SUMMARY

Such width of the two connecting portions may cause the piezoelectric plates to thermally shrink during a baking process, resulting in a large amount of deformation of the piezoelectric plates. On the other hand, the spacing between the two connecting portions may not cause the piezoelectric plates to thermally shrink during the baking process because there is no electrode on the spacing. Accordingly, the piezoelectric plates may bend at the spacing.

One or more aspects of the disclosure provide a piezoelectric actuator that may include one or more piezoelectric plates with less bend.

In one or more aspects of the disclosure, an inkjet head includes a channel unit and a piezoelectric actuator. The channel unit includes a plate, the plate including a plurality of nozzles penetrating the plate in a first direction. The piezoelectric actuator includes: a first piezoelectric plate including a first surface; a first electrode disposed on the first surface, the first electrode including a first extending portion extending in a second direction orthogonal to the first direction; a second piezoelectric plate including a second surface; a second electrode disposed on the second surface, the second electrode including a second extending portion extending in the second direction; a conductive member including a first conductive portion and a second conductive portion, the first conductive portion being disposed on the first surface, the second conductive portion being disposed on the second surface, the conductive portion covering, in the first direction, a spacing that is located between the first extending portion and the second extending portion in the second direction.

In one or more aspects of the disclosure, an inkjet head includes a channel unit and a piezoelectric actuator. The channel unit includes a plate, the plate including a plurality of nozzles penetrating the plate in a first direction. The piezoelectric actuator includes: a first piezoelectric plate including a first surface; a first electrode disposed on the first surface, the first electrode including a first extending portion extending in a second direction orthogonal to the first direction; a second electrode disposed on the first surface, the second electrode including a second extending portion extending in the second direction; a second piezoelectric plate including a second surface; a conductive member disposed on the second surface, the conductive portion covering, in the first direction, a spacing that is located between the first extending portion and the second extending portion in the second direction.

A piezoelectric actuator that is included in the inkjet head may possess novelty and utility.

BRIEF DESCRIPTION OF THE DRAWINGS

FIG. 4 is a sectional view taken along line IV-IV of FIG. 3.

FIG. 5A is a sectional view taken along line V-V of FIG. 3.

DETAILED DESCRIPTION

In the following description, a Z direction corresponds to a vertical direction, and each of an X direction and a Y direction corresponds to a horizontal direction. Each of the X direction and the Y direction is orthogonal to the Z direction. The X direction is orthogonal to the Y direction. The Z direction is an example of a "first direction". The Y direction is an example of a "second direction". The X direction is an example of a "third direction".

Configuration of Printer

Figure 1:
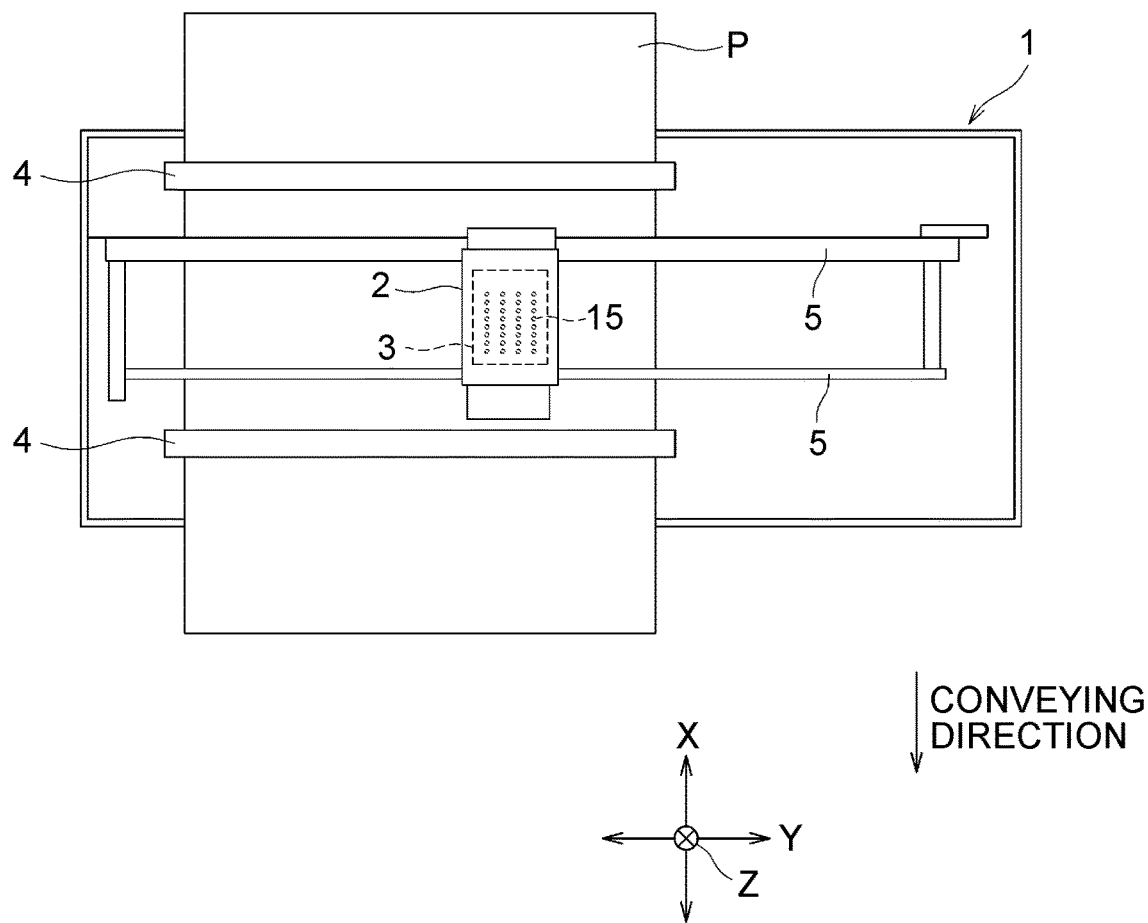
FIG. 1 is a diagram of a general configuration of a printer including a piezoelectric actuator according to a first illustrative embodiment of the disclosure.

As illustrated in FIG. 1, a printer 1 includes a carriage 2, a head 3, and two pairs of conveying rollers 4.

The carriage 2 is configured to move in the Y direction along a pair of guide rails 5 each extending in the Y direction.

The head 3 has a serial type mechanism. The head 3 is mounted on the carriage 2, and is configured to move in the Y direction with the carriage 2. A lower surface of the head 3 includes a plurality of nozzles 15.

The carriage 2 is disposed between each of the pair of conveying rollers 4 in the X direction. Each of the pair of conveying rollers 4 are configured to rotate while holding a sheet P therebetween, and convey the sheet P in the conveying direction.

Configuration of Head

Figure 3:
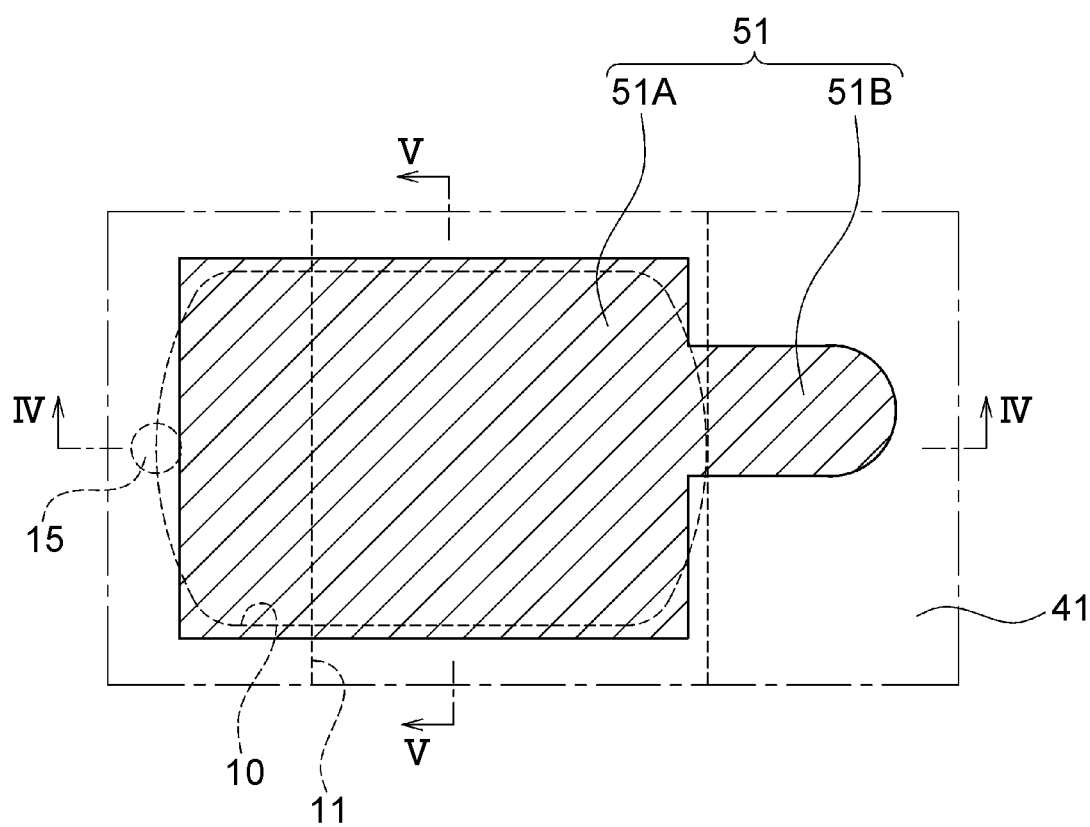
FIG. 3 is an enlarged view of a region III of FIG. 2.

As illustrated in FIG. 3, the head 3 includes a channel unit 21 and a piezoelectric actuator 22.

Configuration of Channel Unit

As illustrated in FIG. 4, the channel unit 21 includes four plates 31, 32, 33 and 34 that are stacked in the Z direction.

The plate 31 includes a plurality of pressure chambers 10. The plate 32 includes a plurality of communication channels 12 and 13. Each of the communication channels 12 and 13 is disposed under a corresponding pressure chamber 10 in the Z direction. Each of the communication channels 12 is connected to each end in the Y direction of the corresponding pressure chamber 10 in the Z direction. The plate 33 includes a plurality of communication channels 14. Each of the communication channels 14 is disposed below a corresponding communication channel 13 in the Z direction, and is connected to the corresponding communication channel 13. The plate 33 includes twelve manifold channels 11. The manifold channels 11 are associated with a plurality of pressure chamber rows 10R (shown in FIG. 2), respectively. The plurality of pressure chamber rows 10R are arranged in the Y direction. Each of the plurality of pressure chamber rows 10R includes a plurality of pressure chambers 10 arranged in the X direction. Each of the manifold channels 11 extends in the X direction, and is configured to communicate with the plurality of pressure chambers 10 in a corresponding pressure chamber row 10R via the communication channel 12. The plate 34 includes a plurality of nozzles 15. The plurality of nozzles 15 penetrate the plate 34. Each of the plurality of nozzles 15 is disposed under a corresponding communication channel 14 in the Z direction, and is connected to the corresponding communication channel 14.

Figure 2:
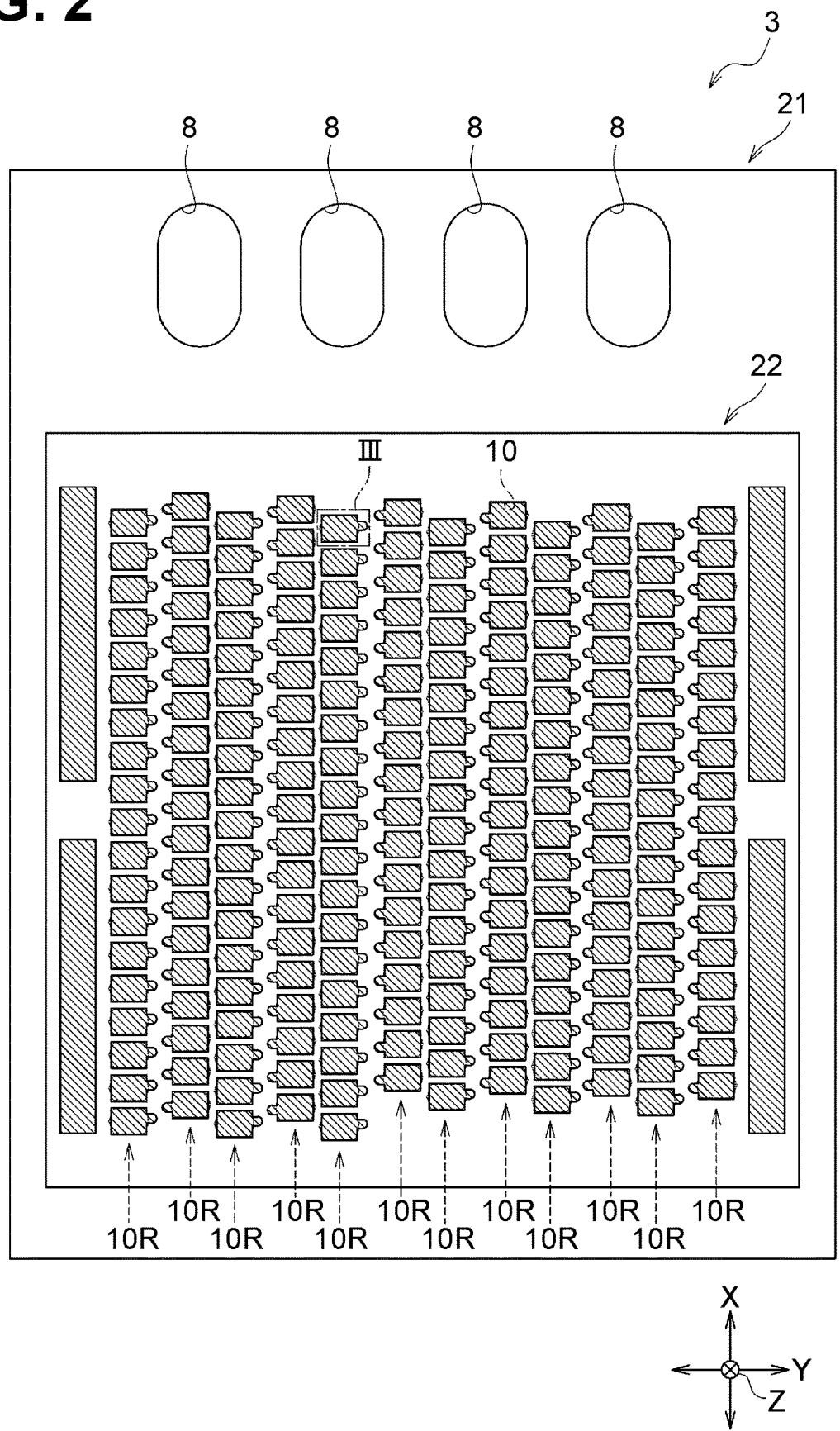
FIG. 2 is a plane view of an inkjet head of FIG. 1.

As illustrated in FIG. 2, the plate 31 includes four ink supply ports 8. The four ink supply ports 8 are disposed in an area, of the plate 31, separate from the piezoelectric actuator 22. Each of the ink supply ports 8 is configured to communicate with an ink cartridge and corresponding three manifold channels 11. The ink cartridge stores ink to be supplied to the three manifold channels 11 through a corresponding ink supply port 8. Each of the three manifold channels 11 is configured to supply ink to a plurality of pressure chambers 10 in a corresponding pressure chamber row 10R through the communication channel 12.

Configuration of Piezoelectric Actuator

As illustrated in FIG. 4, a piezoelectric actuator 22 is disposed on an upper surface of a channel unit 21. The piezoelectric actuator 22 includes three piezoelectric plates 41, 42 and 43, an ink separation plate 44, a plurality of driving electrodes 51, a high potential electrode 52, and a low potential electrode 53. The three piezoelectric plates 41, 42 and 43 and the ink separation plate 44 are stacked in the Z direction.

The ink separation plate 44 is disposed on an upper surface of the plate 31, and covers all of the plurality of pressure chambers 10. The ink separation plate 44 may be made of a metal such as a stainless steel, a piezoelectric material containing lead zirconate titanate, a synthetic resin material, or other proper materials.

The piezoelectric plate 43 is disposed on an upper surface of the ink separation plate 44. The piezoelectric plate 42 is disposed on an upper surface 42N of the piezoelectric plate 43. The piezoelectric plate 41 is disposed on an upper surface 42M of the piezoelectric plate 42. The piezoelectric plates 41, 42 and 43 may be made of a piezoelectric material containing lead zirconate titanate, or other proper materials.

As illustrated in FIG. 3, each of the plurality of driving electrodes 51 is disposed on an upper surface of the piezoelectric plate 41. Each of the plurality of driving electrodes 51 is associated with a corresponding pressure chamber 10. Each driving electrode 51 includes a main portion 51A and a protruding portion 51B. The main portion 51A covers a corresponding pressure chamber 10 in the Z direction. The protruding portion 51B protrudes from the main portion 51A along the Y direction, and does not overlap the corresponding pressure chamber 10 in the Z direction. The protruding portion 51B includes a contact that is electrically connected to a wiring of a Chip On Film (COF). A driver IC is mounted on the COF, and is configured to apply either of a high potential (VDD potential) or a low potential (GND potential) to each driving electrode 51 via the wiring of the COF.

Figure 7:
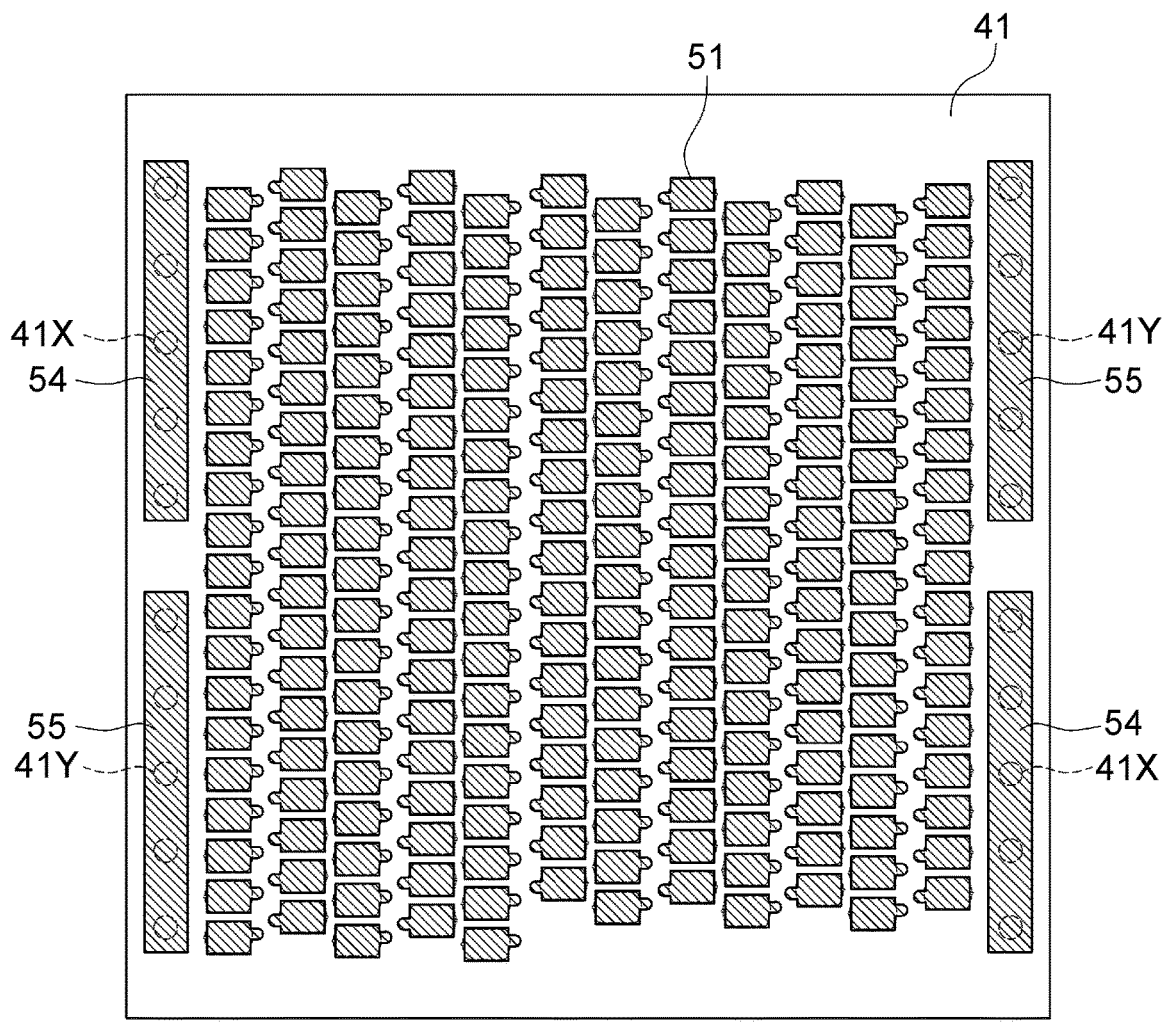
FIG. 7 is a plane view of an upper surface of an upper piezoelectric plate among three piezoelectric plates included in the piezoelectric actuator of FIG. 2.

As illustrated in FIG. 7, the plurality of driving electrodes 51, two high potential terminals 54, and two low potential terminals 55 are disposed on the upper surface of the piezoelectric plate 41. The driver IC is configured to apply a high potential (VDD potential) to each high potential terminal 54, and is configured to apply a low potential (GND potential) to each low potential terminal 55 via the wiring of the COF.

As illustrated in FIG. 4, the high potential electrode 52 is disposed on an upper surface 42M of the piezoelectric plate 42. The high potential electrode 52 is sandwiched between the piezoelectric plate 41 and the piezoelectric plate 42.

Figure 8:
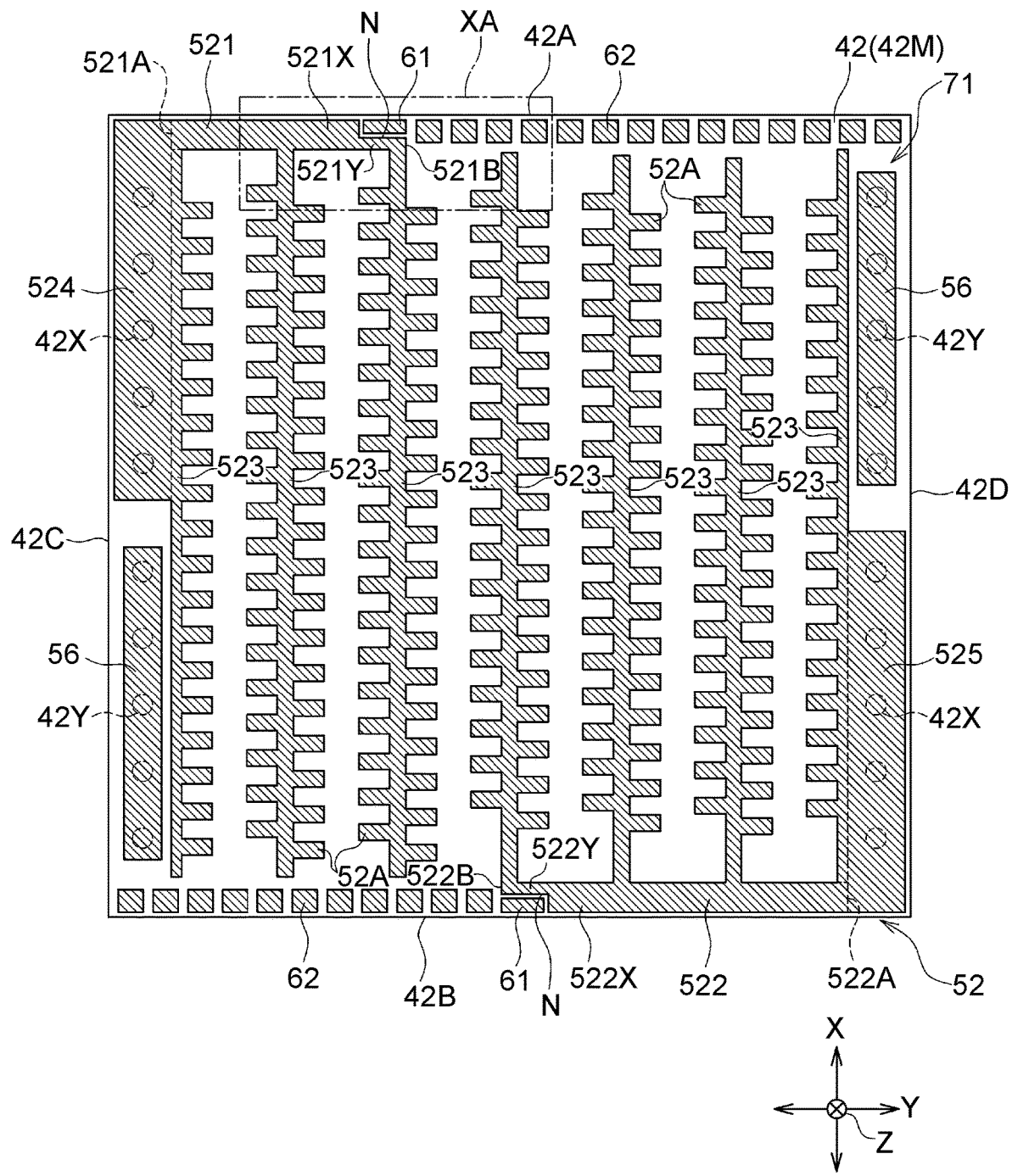
FIG. 8 is a plane view of an upper surface of an intermediate piezoelectric plate among three piezoelectric plates included in the piezoelectric actuator of FIG. 2.

As illustrated in FIG. 8, the high potential electrode 52 includes first extending portions 521 and 522, a plurality of first branching portions 523, a plurality of individual portions 52A, and connecting portions 524 and 525. Each of the plurality of first branching portions 523 is branched from either of the first extending portions 521 or 522. The plurality of individual portions 52A are arranged in the X direction, and connected to the first branching portions 523. The connecting portions 524 and 525 are connected to the first extending portions 521 and 522, respectively. As illustrated in FIG. 5A, each individual portion 52A is located over an area of a corresponding pressure chamber 10.

The first extending portion 521 extends in the Y direction along an upper end 42A of the piezoelectric plate 42, and extends from a left end 42C of the piezoelectric plate 42 toward the center of the piezoelectric plate 42. The first extending portion 521 has a left end 521A and a right end 521B in the Y direction.

The first extending portion 522 extends in the Y direction along a lower end 42B of the piezoelectric plate 42, and extends from a right end 42D of the piezoelectric plate 42 toward the center of the piezoelectric plate 42. The first extending portion 522 has a right end 522A and a left end 522B in the Y direction.

Each of the right end 521B of the first extending portion 521 and the left end 522B of the first extending portion 522 includes a notch N. The notch N is located adjacent to each of the upper end 42A and the lower end 42B, and shapes narrow portions 521Y and 522Y of the first extending portions 521 and 522, respectively. The first extending portions 521 and 522 have wide portions 521X and 522X from which the narrow portions 521Y and 522Y extends respectively. Each width of the narrow portions 521Y and 522Y is less than each width of the wide portions 521X and 522X in the X direction.

Three first branching portions 523 extend in the X direction from the first extending portion 521. The three first branching portions 523 extend from the upper end 42A toward the lower end 42B. Four first branching portions 523 extend in the X direction from the first extending portion 522. The four first branching portions 523 extend from the lower end 42B toward the upper end 42A. That is, the direction in which the three first branching portions 523 extend from the first extending portion 521 is opposite to the direction in which the four first branching portions 523 extend from the first extending portion 522.

The connecting portion 524 extends in the X direction along the left end 42C, and extends from the upper end 42A toward the center of the piezoelectric plate 42. The connecting portion 524 is connected to the left end 521A of the first extending portion 521 in the Y direction, and is connected to the first branching portion 523 that is located closer to the left end 42C than any other first branching portions 523.

The connecting portion 525 extends in the X direction along the right end 42D, and extends from the lower end 42B toward the center of the piezoelectric plate 42. The connecting portion 525 is connected to the right end 522A of the first extending portion 522 in the Y direction, and is connected to the first branching portion 523 that is located closer to the right end 42D than any other first branching portions 523.

Each of the connecting portions 524 and 525 is connected electrically to the high potential terminal 54. More specifically, a conductive material (not shown in figures) is disposed in a through hole 41X (shown in FIG. 7) that is included in the piezoelectric plate 41. The conductive material connects to the high potential 54 and each of the connecting portions 524 and 525. Accordingly, the high potential electrode 52 including the connecting portions 524 and 525 is connected electrically to the high potential terminal 54.

Two connecting electrodes 56, two electrodes 61 and a plurality of electrodes 62 are disposed on the upper surface 42M of the piezoelectric plate 42 in addition to the high potential electrode 52.

One of the connecting electrodes 56 extends in the X direction along the left end 42C. The other of the connecting electrodes 56 extends in the X direction along the right end 42D. Each of the connecting electrodes 56 is connected electrically to the low potential terminal 55. More specifically, a conductive material (not shown in figures) is disposed in a through hole 41Y (shown in FIG. 7) that is included in the piezoelectric plate 41. The conductive material connects to the low potential terminal 55 and each of the connecting electrodes 56.

One of the electrodes 61 is located in an area of the notch N at the upper end 42A, and is disposed adjacent to the narrow portion 521Y in the X direction and adjacent to the wide portion 521X in the Y direction. The other of the electrodes 61 is located in an area of the notch N at the lower end 42B, and is disposed adjacent to the narrow portion 522Y in the X direction and adjacent to the wide portion 522X in the Y direction. The electrode 61 may be an example of an "aligning electrode".

The plurality of the electrodes 62 are disposed along each of the upper end 42A and the lower end 42B, and arranged with a space therebetween in the Y direction. The plurality of electrodes 62 are separate from each first extending portion 521 and 522, and the electrode 61 in the Y direction.

Each electrode 61 and 62 is not connected electrically to any of the high potential terminal 54 and the low potential terminal 55, whereby an electric charge is not applied to the electrodes 61 and 62 from the driver IC.

As illustrated in FIG. 4, the low potential electrode 53 is disposed on the upper surface 42N of the piezoelectric plate 43. The low potential electrode 53 is sandwiched between the piezoelectric plate 42 and the piezoelectric plate 43.

Figure 5B:
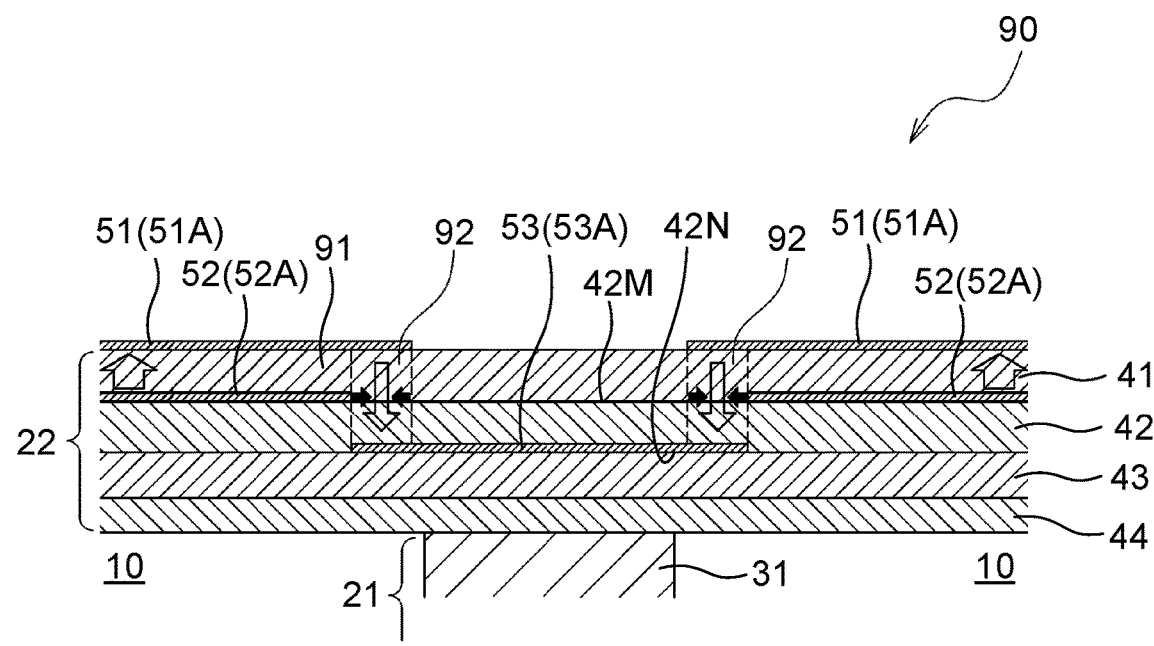
FIG. 5B is a sectional view of a part of the piezoelectric actuator of FIG. 2.
Figure 9:
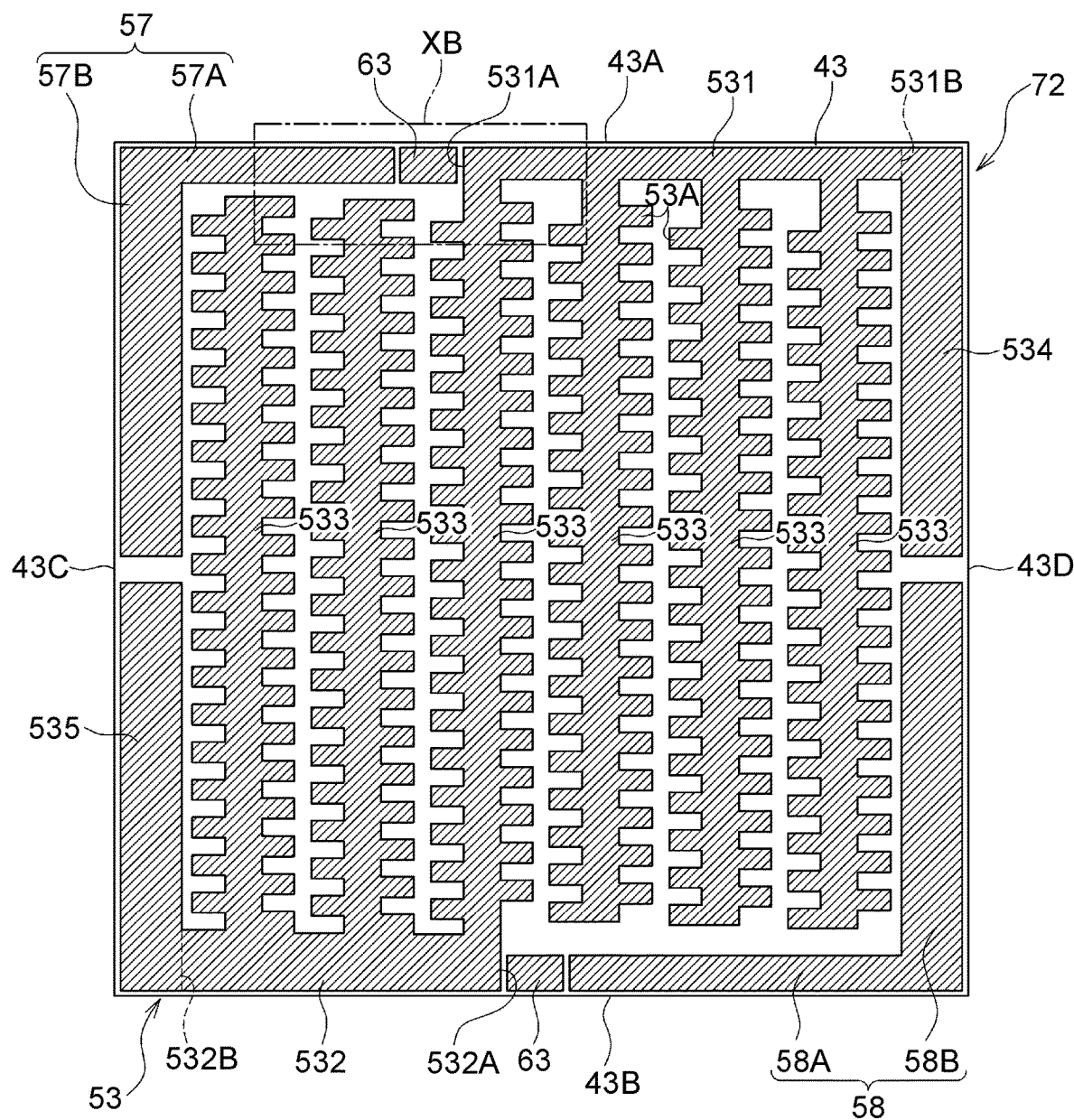
FIG. 9 is a plane view of an upper surface of a lower piezoelectric plate among three piezoelectric plates included in the piezoelectric actuator of FIG. 2.

As illustrated in FIG. 9, the low potential electrode 53 includes second extending portions 531 and 532, a plurality of second branching portions 533, a plurality of individual portions 53A, and connecting portions 534 and 535. Each of the plurality of second branching portions 533 is branched from a corresponding second extending portion 531 or 532. The plurality of individual portions 53A are arranged in the X direction, and connected to the second branching portions 533. The connecting portions 534 and 535 are connected to the second extending portions 531 and 532, respectively. As illustrated in FIG. 5A, a part of each individual portion 53A, which is other than the individual portion 53A located at each end in the X direction, overlaps a part of the pressure chamber 10 in the Z direction. As illustrated in FIG. 5B, each individual portion 53A, which is other than the individual portion 53A located at each end in the X direction, entirely overlaps, in the Z direction, each part of two pressure chambers 10 adjacent to each other in the X direction and a part of the plate 31 sandwiched by the two pressure chambers 10. A part of the individual portion 53A located at each end in the X direction overlaps a part of one pressure chamber 10 in the Z direction. The individual portion 53A located at each end in the X direction entirely overlaps, in the Z direction, a part of one pressure chamber 10 and a part of the plate 31 adjacent to the one pressure chamber 10.

The second extending portion 531 extends in the Y direction along an upper end 43A of the piezoelectric plate 43, and extends from the center of the piezoelectric plate 43 toward a right end 43D of the piezoelectric plate 43. The second extending portion 531 has a left end 531A and a right end 531B in the Y direction.

The second extending portion 532 extends in the Y direction along a lower end 43B of the piezoelectric plate 43, and extends from the center of the piezoelectric plate 43 toward a left end 43C of the piezoelectric plate 43. The second extending portion 532 has a right end 532A and a left end 532B in the Y direction.

As illustrated in FIGS. 8 and 9, the right end 521B of the first extending portion 521 and the left end 531A of the second extending portion 531 are located between the left end 521A of the first extending portion 521 and the right end 531B of the second extending portion 531 in the Y direction. The left end 522B of the first extending portion 522 and the right end 532A of the second extending portion 532 are located between the right end 522A of the first extending portion 522 and the left end 532B of the second extending portion 532 in the Y direction.

The low potential electrode 53 includes six branching portions 533 each extending in the X direction. Three second branching portions 533 extend from the upper end 43A (i.e., the second extending portion 531) toward the lower end 43B. Two second branching portions 533 extend from the lower end 43B (i.e., the second extending portion 532) toward the upper end 43A. One branching portion 533 that is located between the three second branching portions 533 and the two second branching portions 533 extends from each of the upper end 43A and the lower end 43B.

The connecting portion 534 extends in the X direction along the right end 43D, and extends from the upper end 43A toward the center of the piezoelectric plate 43. The connecting portion 534 is connected to the right end 531B of the second extending portion 531.

The connecting portion 535 extends in the X direction along the left end 43C, and extends from the lower end 43B toward the center of the piezoelectric plate 43. The connecting portion 535 is connected to the left end 532B of the second extending portion 532.

As illustrated in FIG. 8, the piezoelectric plate 42 includes a through hole 42Y. The connecting portions 534 and 535 are connected electrically to the connecting electrodes 56. More specifically, a conductive material (not shown in figures) is disposed in the through hole 42Y. The conductive material connects to the connecting electrodes 56 and each of the connecting portions 534 and 535. The connecting electrodes 56 are connected electrically to the low potential terminal 55 via the conductive material in the through hole 41Y of the piezoelectric plate 41 shown in FIG. 7. Accordingly, the low potential electrode 53 including the connecting portions 534 and 535 is connected electrically to the low potential terminal 55.

As illustrated in FIG. 9, in addition to the low potential electrode 53, a connecting electrode 57, a connecting electrode 58, and two electrodes 63 are disposed on an upper surface 42N of the piezoelectric plate 43.

The connecting electrode 57 includes a portion 57A and a portion 57B. The portion 57A extends in the Y direction along the upper end 43A, and extends from the left end 43C toward the center of the piezoelectric plate 43. The portion 57B extends in the X direction along the left end 43C, and extends from the upper end 43A toward the center of the piezoelectric plate 43. The connecting electrode 58 includes a portion 58A and a portion 58B. The portion 58A extends in the Y direction along the lower end 43B, and extends from the right end 43D toward the center of the piezoelectric plate 43. The portion 58B extends in the X direction along the right end 43D, and extends from the lower end 43B toward the center of the piezoelectric plate 43.

As illustrated in FIG. 8, the piezoelectric plate 42 includes a through hole 42X. The connecting electrodes 57 and 58 are connected electrically to the connecting portions 524 and 525 respectively. More specifically, a conductive material (not shown in figures) is disposed in the through hole 42X. The conductive material connects to the connecting electrodes 57 and 58, and the connecting portions 524 and 525. The connecting portions 524 and 525 are connected electrically to the high potential terminal 54 via the conductive material in the through hole 41X of the piezoelectric plate 41 shown in FIG. 7. Accordingly, the connecting portions 57 and 58 are connected electrically to the high potential terminal 54.

The connecting electrodes 57 and 58 are disposed under the connecting portions 524 and 525 of the high potential electrode 52 and are connected electrically to the connecting portions 524 and 525. The connecting electrodes 57 and 58 may enable to increase the number of electric paths through which the electric charge applied to the high potential terminal 54 is distributed to the high potential electrode 52, thereby improving the electrical reliability.

As illustrated in FIG. 9, one of the electrodes 63 is disposed adjacent to the upper end 43A, and is separate from the second extending portion 531. The one of the electrodes 63 is disposed between the second extending portion 531 and the portion 57A of the connecting electrode 57. The one of the electrodes 63 is closer to the left end 531A of the second extending portion 531 than the right end 531B of the second extending portion 531. The other of the electrodes 63 is disposed adjacent to the lower end 43B, and is separate from the second extending portion 532. The other of the electrodes 63 is disposed between the second extending portion 532 and the portion 58A of the connecting electrode 58. The other of the electrodes 63 is closer to the right end 532A of the second extending portion 532 than the left end 532B of the second extending portion 532.

Each of the two electrodes 63 is not connected electrically to any of the high potential terminal 54 and the low potential terminal 55, whereby an electric charge is not applied to the electrodes 63 from the driver IC.

Actuator

As illustrated in FIG. 5A, the driving electrode 51 and the individual portion 52A of the high potential electrode 52 sandwiches a portion of the piezoelectric plate 41 in the Z direction. The sandwiched portion may be referred to as a first active portion 91. The driving electrode 51 and the individual portion 53A of the low potential electrode 53 sandwiches a portion of the piezoelectric plates 41 and 42 in the Z direction. The sandwiched portion may be referred to as a second active portion 92. The first active portion 91 may be mainly polarized upward. The second active portion 92 may be mainly polarized downward. The piezoelectric actuator 22 includes a plurality of actuator portions 90. Each actuator portion 90, that includes one first active portion 91 and two second active portions 92, is associated with a corresponding pressure chamber 10.

Operation of the actuator portion 90 corresponding to a certain nozzle 15 for ejecting ink from the certain nozzle 15 will be described with reference to FIG. 6.

Figure 6A:
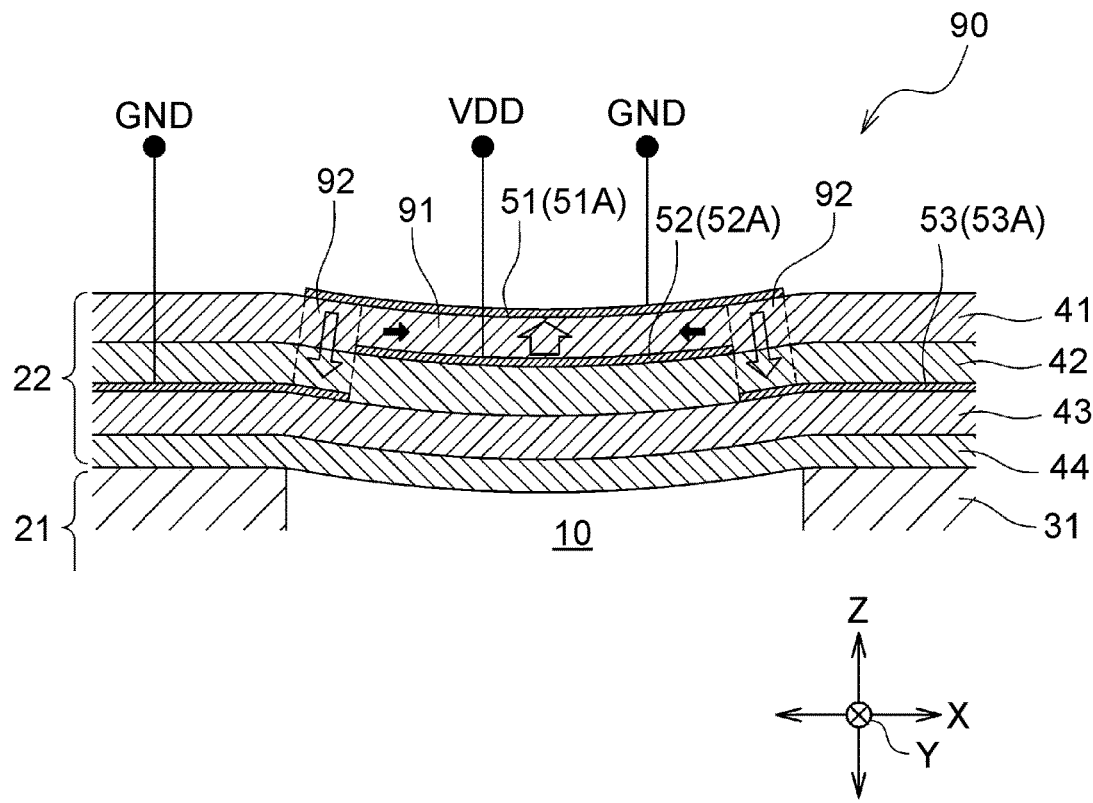
FIG. 6A is a diagram illustrating operation of an actuator portion at the section V-V of FIG. 5A.

Before the printer 1 starts printing, as illustrated in FIG. 6A, each driving electrode 51 is at the low potential (GND potential). This causes an upward electric field equal to the polarization direction in the first active portion 91 due to the potential difference between the driving electrode 51 and the high potential electrode 52, resulting in contraction of the first active portion 91 in a surface direction (i.e., the direction along the X direction and the Y direction). Accordingly, a stacked portion of the piezoelectric plates 41, 42 and 43 and the ink separation plate 44 that overlaps the pressure chamber 10 in the Z direction is bent downward so as to be convex toward the pressure chamber 10. The volume of the pressure chamber 10 in a state where the stacked portion is bent downward is less than that in a state where the stacked portion is flat, which is described later.

Figure 6B:
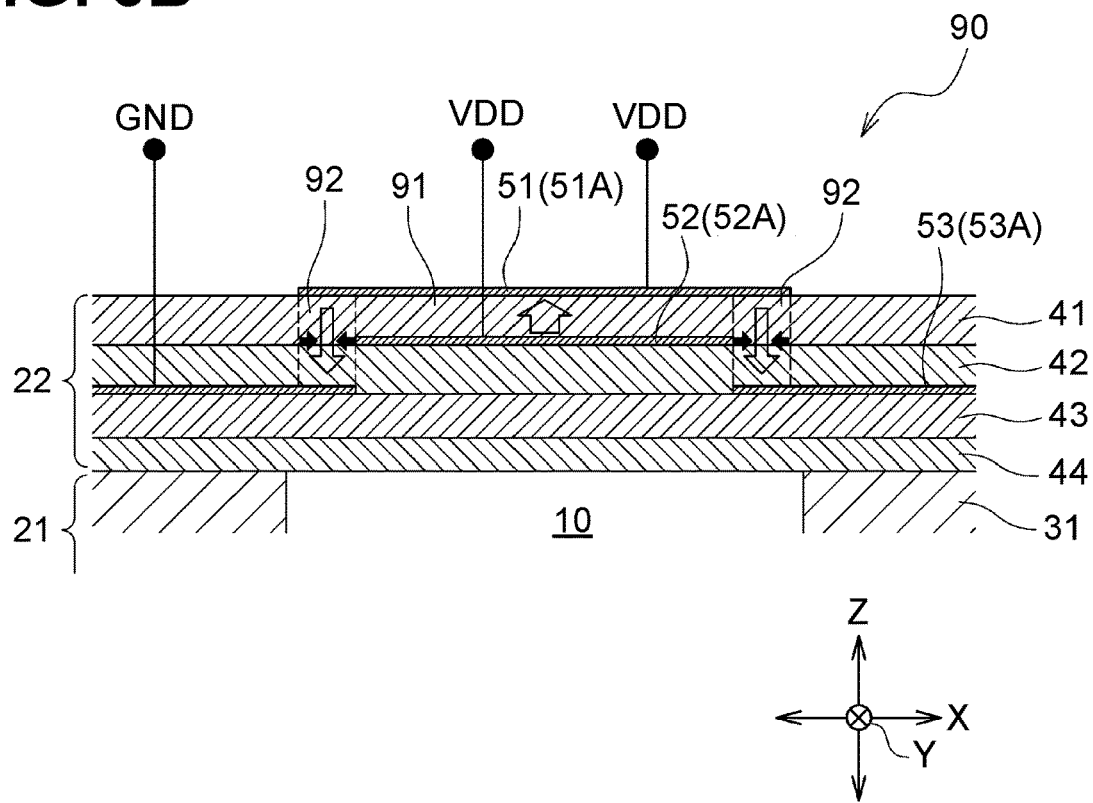
FIG. 6B is a diagram illustrating operation of the actuator portion at the section V-V of FIG. 5A.

In response to that the printer 1 starts printing, as illustrated in FIG. 6B, the potential of the driving electrode 51 is switched from a low potential (GND potential) to a high potential (VDD potential). This switching eliminates the potential difference between the driving electrode 51 and the high potential electrode 52, thereby reducing of the contraction of the first active portion 91. The switching causes a downward electric field equal to the polarization direction in the second active portion 92 due to the potential difference between the driving electrode 51 and the low potential electrode 53, resulting in contraction of the second active portion 92 in the surface direction. The second active portion 92 has a characteristic of reducing a crosstalk. The crosstalk is a phenomenon in which a pressure fluctuation caused by deformation of the actuator portion 90 in a certain pressure chamber 10 is transmitted to another pressure chamber 10 adjacent to the certain pressure chamber 10 in the X direction. While the second active portion 92 contracts, the contraction of the second active portion 92 may not contribute to deformation of the actuator portion 90 because of the crosstalk characteristic. Thus, the stacked portion may not be bent upward, and may be in a flat state. The volume of the pressure chamber 10 in the state of FIG. 6B is greater than that in the state of FIG. 6A.

Thereafter, the potential of the driving electrode 51 is switched from the high potential (VDD potential) to the low potential (GND potential), whereby the state of the stacked portion returns to the state illustrated in FIG. 6A. This switching eliminates the potential difference between the driving electrode 51 and the high potential electrode 53, thereby reducing of the contraction of the second active portion 92. The switching causes a downward electric field equal to the polarization direction in the first active portion 91 due to the potential difference between the driving electrode 51 and the low potential electrode 52, resulting in contraction of the first active portion 91 in the surface direction. Accordingly, the portion of the stacked portion overlapping the pressure chamber 10 in the Z direction may bend downward. This bending causes the volume of the pressure chamber 10 to be greatly reduced, resulting in a large pressure applied to the ink in the pressure chamber 10. Accordingly, the large pressure ejects ink from the nozzle 15.

Feature of First Illustrative Embodiment of the Disclosure

As illustrated in FIGS. 4 and 5, the piezoelectric plate 42 has the upper surface 42M, and the piezoelectric plate 43 has the upper surface 42N. The piezoelectric plate 42 may be an example of a "first piezoelectric plate". The piezoelectric plate 43 may be an example of a "second piezoelectric plate". The upper surface 42M may be an example of a "first surface". The upper surface 42N may be an example of a "second surface".

As illustrated in FIG. 8, the high potential electrode 52, the connecting electrode 56, and the electrodes 61 and 62 are disposed on the upper surface 42M of the piezoelectric plate 42. The high potential electrode 52 may be an example of a "first electrode".

As illustrated in FIG. 9, the low potential electrode 53, the connecting electrode 57, and the electrode 63 are disposed on the upper surface 42N of the piezoelectric plate 43. The low potential electrode 53 may be an example of a "second electrode".

Each of the electrodes, the high potential terminal 54, and the low potential terminal 55 may be made of the same material such as silver, nickel, or gold.

Arrangement of the first extending portion 521 and the second extending portion 531 will be described with reference to FIGS. 10 and 11. Arrangement of the first extending portion 522 and the second extending portion 532 is the same as arrangement of the first extending portion 521 and the second extending portion 531, thus, description of the arrangement of the first extending portion 522 and the second extending portion 532 is skipped.

Figure 10A:
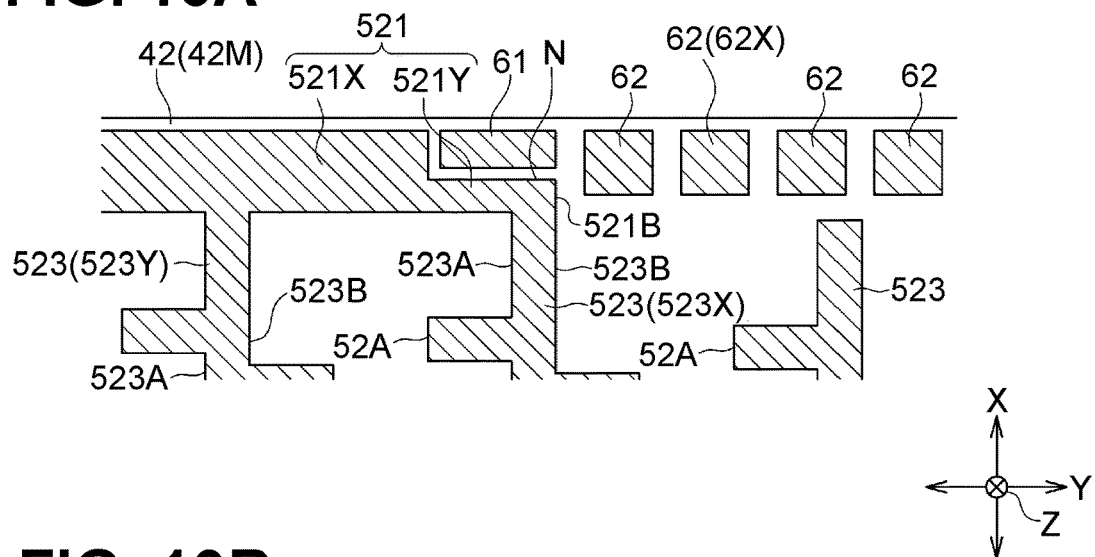
FIG. 10A is an enlarged view of a region XA of FIG. 8.

As illustrated in FIG. 10A, the plurality of first branching portions 523 include a first end branching portion 523X and a first adjacent branching portion 523Y. The first end branching portion 523X is located closer to the right end 521B than any other first extending portion 521 in the Y direction. The first adjacent branching portion 523Y is located left of the first end branching portion 523X, and next to the first end branching portion 523X in the Y direction. The first end branching portion 523X extends in the X direction, and connects to the narrow portion 521Y. The first adjacent branching portion 523Y extends in the X direction, and connects to the wide portion 521X. The electrode 61 is located on an extension of the first branching portion 523X. The right end 523B of the first adjacent branching portion 523Y and the left end 523A of the first end branching portion 523X are located, in the Y direction, between the left end 523A of the first adjacent branching portion 523Y and the right end 523B of the first end branching portion 523X.

The electrode 61 and the narrow portion 521Y are located, in the Y direction, between the left end 523A of the first adjacent branching portion 523Y and the left end 531A (shown in FIG. 10B) of the second extending portion 531. The electrode 61 and the narrow portion 521Y do not align, in the X direction, with the first adjacent branching portion 523Y. The electrode 61 and the narrow portion 521Y are located, in the Y direction, between the right end 523B of the first adjacent branching portion 523Y and the left end 531A (shown in FIG. 10B) of the second extending portion 531. The electrode 61 is included in an area of the notch N of the first extending portion 521. The electrode 61 does not extend beyond the right end 521B of the first extending portion 521.

Figure 10B:
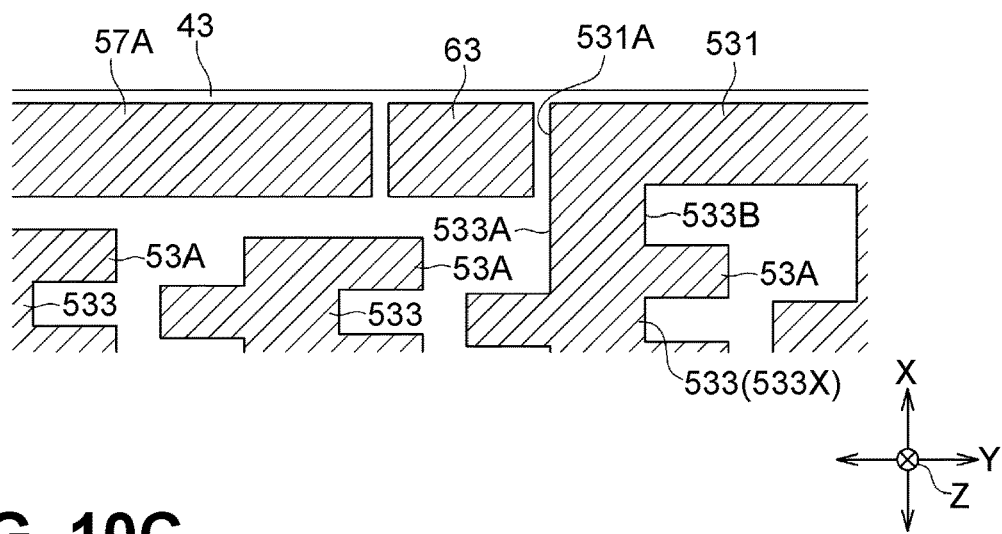
FIG. 10B is an enlarged view of a region XB of FIG. 9.

As illustrated in FIG. 10B, the plurality of second branching portions 533 include a second end branching portion 533X. The second end branching portion 533X is located closer to the left end 531A than any other second branching portion 533 in the Y direction. The second end branching portion 533X has a left end 533A and a right end 533B in the Y direction. The left end 533A of the second end branching portion 533X is at the same position as the left end 531A of the second extending portion 531 in the Y direction.

The electrode 63 is located between the left end 521A of the first extending portion (shown in FIG. 8) and the right end 533B of the second end branching portion 533X. The electrode 63 does not align, in the X direction, with the second end branching portion 533X. The electrode 63 is located, in the Y direction, between the left end 521A of the first extending portion 521 (shown in FIG. 8) and the left end 533A of the second end branching portion 533X.

Figure 10C:
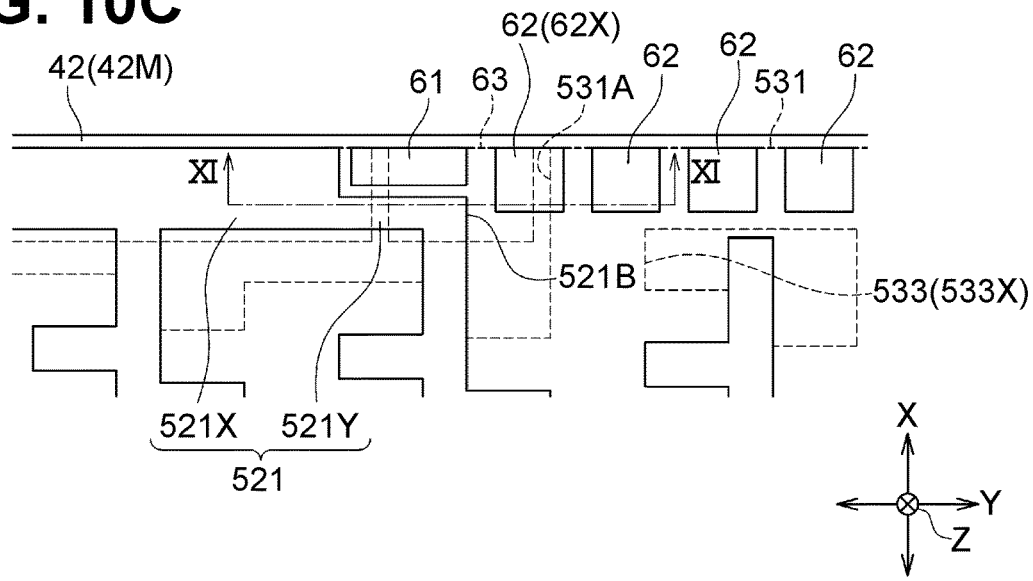
FIG. 10C is a diagram illustrating disposition of an electrode at the region XA and XB.

As illustrated in FIG. 10C, the electrode 63 overlaps, in the Z direction, the narrow portion 521Y and the electrode 61. The electrode 63 is an example of an "overlapping portion".

Figure 11:
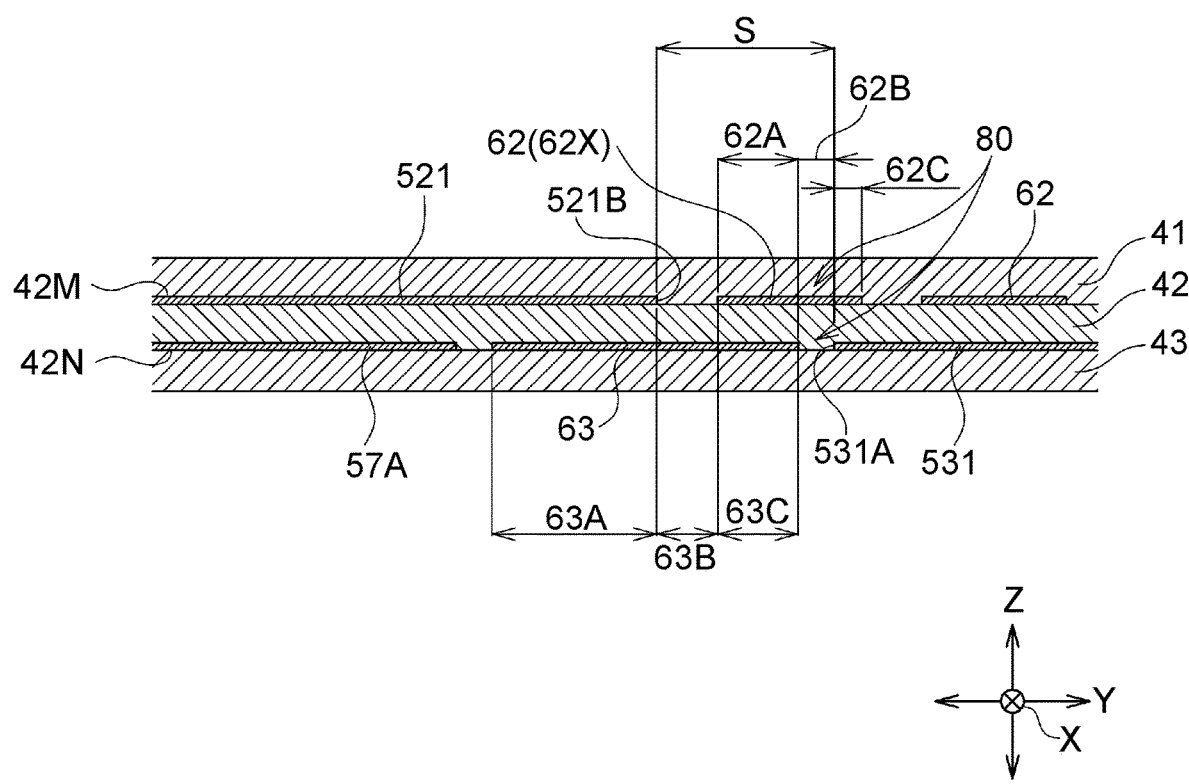
FIG. 11 is a sectional view taken along line XI-XI of FIG. 10C.

As illustrated in FIG. 11, the first extending portion 521 does not overlap, in the Z direction, the second extending portion 531. In other words, a spacing S is located between the right end 521B of the first extending portion 521 and the left end 531A of the second extending portion 531. The spacing S is a region that extends in each of the X direction, the Y direction, and the Z direction. The spacing S includes piezoelectric plates 41, 42, and 43 stacked in the Z direction, and does not include any conductive materials other than the first extending portion 521 and the second extending portion 531.

In this embodiment, the piezoelectric actuator 22 includes a conductive member 80.

The conductive member 80 includes an electrode 62X and the electrode 63. The electrode 62X is one of the plurality of electrodes 62 that is located closer to the right end 521B of the first extending portion 521 than any other electrodes 62 in the Y direction. The electrode 62X may be an example of a "first conductive portion". The electrode 63 may be an example of a "second conductive portion".

The electrode 62X includes portions 62A, 62B, and 62C. The portion 62A overlaps the electrode 63 in the Z direction. The portion 62B overlaps neither the electrode 63 nor the second extending portion 531. The portion 62C overlaps the second extending portion 531 in the Z direction. The portion 62B is located between the portion 62A and the portion 62C in the Y direction.

The electrode 63 includes portions 63A, 63B, and 63C. The portion 63A overlaps the first extending portion 521 in the Z direction. The portion 63B overlaps neither the first extending portion 521 nor the electrode 62X. The portion 63C overlaps the electrode 62X in the Z direction. The portion 63B is located between the portion 63 A and the portion 63C in the Y direction.

The portions 62A and 62B of the electrode 62X and the portions 63B and 63C of the electrode 63 overlap the spacing S in the Z direction. That is, the electrode 63 partially overlaps the electrode 62X at a part of the spacing S in the Z direction.

In the first illustrative embodiment, the conductive member 80 includes the electrode 62X and the electrode 63. The electrode 62X spreads across a part of the spacing S between the electrode 63 and the second extending portion 531, and partially overlaps the electrode 63 (i.e., the portion 63C) and the second extending portion 531 in the Z direction. The electrode 63 spreads across a part of the spacing S between the first extending portion 521 and the electrode 62X, and partially overlaps the first extending portion 521 and the electrode 62X (i.e., the portion 62A) in the Z direction. Accordingly, the conductive member 80 including the two electrodes 62X and 63 partially overlaps the first extending portion 521 and the second extending portion 531 in the Z direction, thereby overlapping the spacing S in the Z direction.

According to the first illustrative embodiment, the piezoelectric actuator 22 includes the conductive member 80. The conductive member 80 partially overlaps the first extending portion 521 and the second extending portion 531 in the Z direction, thereby overlapping the spacing S. Due to existence of the conductive member 80, the piezoelectric actuator 22 may cause entirely, including the spacing S, the heat contraction, whereby the piezoelectric actuator with less bend may be provided. Accordingly, variation of deformation characteristics may be almost the same at each portion in the piezoelectric actuator 22, whereby variation of characteristics of ink ejection may also be the same at each nozzle.

As illustrated in FIG. 10A, the narrow portion 521Y is disposed adjacent to the right end 521B of the first extending portion 521. In a comparative example in which the narrow portion 521Y does not exist, a long length of the first extending portion 521 in the Y direction may cause the thermal shrinkage of the first extending portion 521. The degree of this thermal shrinkage may be different from the degree of the thermal shrinkage of the spacing S, whereby bending may easily occur. On the other hand, in the first illustrative embodiment, due to the existence of the narrow portion 521Y, a part of the first extending portion 521 becomes short in the Y direction. Accordingly, the thermal shrinkage may be reduced, and bending may be suppressed.

The piezoelectric actuator 22 includes the electrodes 61 and the electrode 63. As illustrated in FIG. 8, one of the electrodes 61 disposed on the upper surface 42M of the piezoelectric plate 42 aligns with the narrow portion 521Y in the X direction, and the other of the electrodes 61 aligns with the narrow portions 522Y in the X direction. As illustrated in FIGS. 10B and 10C, one of the electrodes 63 disposed on the upper surface 42N of the piezoelectric plate 43 overlaps the narrow portion 521Y and one of the electrodes 61 in the Z direction. The existence of the electrodes 61 and the electrodes 63 may enable to suppress the reduction in the rigidity of the notch N portion.

As illustrated in FIG. 10A, the narrow portion 521Y and the electrode 61 are disposed at the right side of the right end 523B of the first adjacent branching portion 523Y. This disposition may enable to suppress a problem that electricity from the first extending portion 521 to the first adjacent branching portion 523Y is not supplied due to the existence of the narrow portion 521Y.

As illustrated in FIG. 10B, the electrode 63 is disposed at left of the left end 533A of the second end branching portion 533X. This disposition may enable a boundary portion between the second extending portion 531 and the second end branching portion 533X to be wide, thereby suppressing a problem that electricity from the second extending portion 531 to the second end branching portion 533X is not supplied.

The high potential electrode 52, the low potential electrode 53, and the electrodes 62X and 63 in the conductive member 80 are made of the same material. This configuration may enable easy manufacturing. This configuration may also enable the thermal shrinkage rates to be uniform, and a problem such as warpage due to a difference in thermal shrinkage to suppress.

The electrodes 52 and 53 are connected electrically to the high potential terminal 54 and the low potential terminal 55 respectively. On the other hand, the electrodes 62X and 63 in the conductive member 80 are not connected electrically to any of the high potential terminal 54 and the low potential terminal 55. Since the electrodes are not connected electrically to any of the high potential terminal 54 or the low potential terminal 55, an electrical breakdown may be suppressed.

Second Illustrative Embodiment

Figure 12:
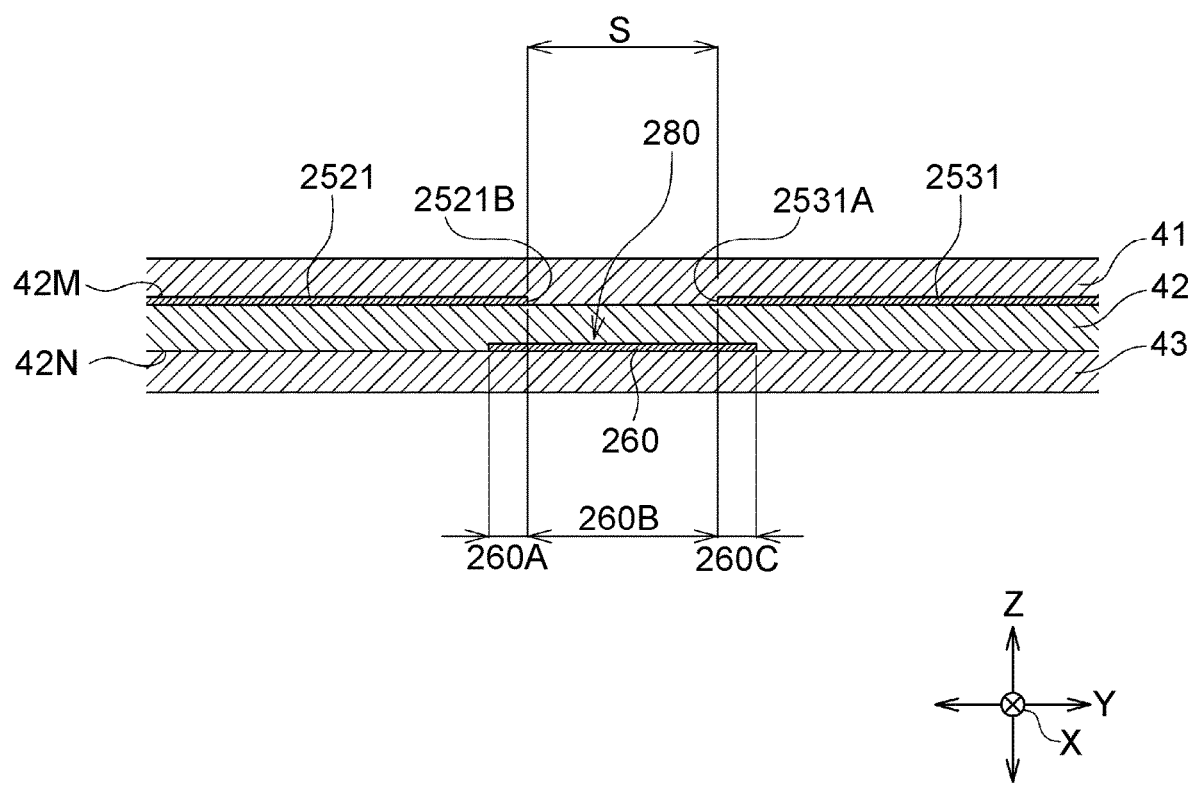
FIG. 12 is a diagram illustrating a piezoelectric actuator according to a second illustrative embodiment of the disclosure.

Piezoelectric actuator in the second illustrative embodiment will be described with reference to FIG. 12.

The piezoelectric actuator in the second illustrative embodiment includes a first electrode and a second electrode. The first electrode includes a first extending portion 2521. The second electrode includes a second extending portion 2531. The first extending portion 2521 and the second extending portion 2531 are disposed on the same surface 42M of the piezoelectric plate 42.

The piezoelectric actuator includes a plurality of branching portions each branching from one of the first extending portion 2521 and the second extending portion 2531.

The first extending portion 2521 does not overlap, in the Z direction, the second extending portion 2531. In other words, a spacing S is located between the right end 2521B of the first extending portion 2521 and the left end 2531A of the second extending portion 2531. The spacing S is a region that extends in each of the X direction, the Y direction, and the Z direction. The spacing S includes piezoelectric plates 41, 42, and 43 stacked in the Z direction, and does not include any conductive materials other than the first extending portion 2521 and the second extending portion 2531.

In this embodiment, the piezoelectric actuator includes a conductive member 280. The conductive member 280 includes an electrode 260 disposed on the upper surface 42N of the piezoelectric plate 43.

The electrode 260 includes a portions 260A, 260B, and 260C. The portion 260A overlaps the first extending portion 2521 in the Z direction. The portion 260B overlaps neither the first extending portion 2521 nor the second extending portion 2531. The portion 260C overlaps the second extending portion 2531 in the Z direction. The portion 260B is located between the portion 260A and the portion 260C in the Y direction. The portion 260B overlaps the spacing S in the Z direction. Accordingly, the conductive member 280 partially overlaps the first extending portion 2521 and the second extending portion 2531 in the Z direction, thereby overlapping the spacing S in the Z direction.

According to the second illustrative embodiment, the piezoelectric actuator includes the first extending portion 2521, the second extending portion 2531, and the conductive member 280. The first extending portion 2521 and the second extending portion 2531 are disposed on the upper surface 42M, and the conductive member 280 is disposed on the upper surface 42N. The conductive member 280 partially overlaps the first extending portion 2521 and the second extending portion 2531 in the Z direction, thereby overlapping the spacing S in the Z direction. Due to existence of the conductive member 280, the piezoelectric actuator may cause entirely, including the spacing S, the heat contraction, whereby the piezoelectric actuator with less bend may be provided. Accordingly, variation of deformation characteristics may be almost the same at each portion in the piezoelectric actuator 22, whereby variation of characteristics of ink ejection may also be the same at each nozzle.

According to the second illustrative embodiment, the conductive member 280 includes only one conductive portion. This configuration may enable to reduce an amount of conductive materials, and easy manufacturing of the piezoelectric actuator.

MODIFICATION

Various modifications may be applied therein without departing from the spirit and scope of the disclosure.

The conductive member 80 in the first illustrative embodiment may include three or more conductive portions.

The conductive member 280 in the second illustrative embodiment may include two or more conductive portions. In this modification, the two or more conductive portions may be disposed on the different surfaces from each other. In this modification, the conductive member 280 including the two or more conductive portions may overlap the spacing S.

The first adjacent branching portion 523Y may partially or entirely aligns with the narrow portion 521Y in the X direction.

The second extending portion 531 may include a notch that aligns with the second end branching portion 533X in the X direction. In this modification, the electrode 63 may disposed in an area of the notch.

The electrode 61 may be applied an electric charge by being connected electrically to either of the high potential terminal 54 or the low potential terminal 55.

The first electrode, the second electrode, and the conductive member may be made of different materials. For example, at least one of these members may be made of a different material from the others.

The piezoelectric actuator may include single piezoelectric plate. The piezoelectric actuator may include a plurality of piezoelectric plates other than three piezoelectric plates.

The present invention may be applied to such as a facsimile machine, a copying machine, a multifunction machine, instead of the printer. The present invention may be applied to a liquid ejection device not for an image recording (e.g., a liquid ejection device that ejects a conductive liquid onto a substrate to form a conductive pattern).

What is claimed is:

1. An inkjet head comprising:
    a channel unit including a plate, the plate including a plurality of nozzles penetrating the plate in a first direction; and
    a piezoelectric actuator comprising:
        a first piezoelectric plate including a first surface;
        a first electrode disposed on the first surface, the first electrode including a first extending portion extending in a second direction orthogonal to the first direction;
        a second piezoelectric plate including a second surface;
        a second electrode disposed on the second surface, the second electrode including a second extending portion extending in the second direction;
        a spacing that is located between the first extending portion and the second extending portion in the second direction; and
        a conductive member including a first conductive portion and a second conductive portion, the first conductive portion being disposed on the first surface, the second conductive portion being disposed on the second surface, the conductive member covering, in the first direction, the spacing.

2. The inkjet head according to claim 1,
    wherein the first extending portion including a wide portion and a narrow portion, the wide portion having a first width in a third direction orthogonal to each of the first direction and the second direction, the narrow portion having a second width in the third direction less than the first width, and the narrow portion being disposed adjacent to a first end of the first extending portion,
    wherein the piezoelectric actuator further includes an aligning electrode, the aligning electrode aligning with the wide portion in the second direction and the narrow portion in the third direction, and
    wherein the second conductive portion includes an overlapping electrode, the overlapping electrode overlapping each of the narrow portion and the aligning electrode in the first direction.

3. The inkjet head according to claim 2,
    wherein the first electrode further includes a plurality of first branching portions,
    wherein the plurality of first branching portions includes a first end branching portion, the first end branching portion being located closer to the first end of the first extending portion in the second direction than any other of the first branching portions, and the first end branching portion aligning with the narrow portion in the third direction,
    wherein the plurality of first branching portions further includes a first adjacent branching portion, the first adjacent branching portion being located next to the first end branching portion in the second direction, and
    wherein the narrow portion and the aligning electrode are located between an end of the first adjacent branching portion and an end of the second extending portion.

4. The inkjet head according to claim 3,
    wherein the first adjacent branching portion aligns with the wide portion in the third direction, and
    wherein the first adjacent branching portion does not align with the narrow portion in the third direction.

5. The inkjet head according to claim 2,
    wherein the second electrode further includes a plurality of second branching portions, wherein the plurality of second branching portions include a second end branching portion, the second end branching portion being located closer to an end of the second extending portion in the second direction than any other second branching portions, and wherein the overlapping electrode is located between a second end of the first extending portion and a first end of the second end branching portion.

6. The inkjet head according to claim 5, wherein the second end branching portion includes the first end and a second end, the second end of the second end branching portion being closer to the second end of the first extending portion than the first end of the second end branching portion, and wherein the overlapping electrode is located between the second end of the first extending portion and the second end of the second end branching portion.

7. The inkjet head according to claim 1, wherein the first electrode, the second electrode, and the conductive member comprise the same material.

8. The inkjet head according to claim 1, wherein the first electrode is connected electrically to a first connector and has a first potential, wherein the second electrode is connected electrically to a second connector and has a second potential less than the first potential, and wherein the conductive member is not electrically connected to either the first connector or the second connector.

9. The inkjet head according to claim 1, wherein the spacing includes a region that extends in each of the first direction, the second direction, and a third direction orthogonal to each of the first direction and the second direction, and wherein the spacing does not include any conductive materials other than the conductive member.

10. An inkjet head comprising:
a channel unit including a plate, the plate including a plurality of nozzles penetrating the plate in a first direction; and
a piezoelectric actuator comprising:
 a first piezoelectric plate including a first surface;
 a first electrode disposed on the first surface, the first electrode including a first extending portion extending in a second direction orthogonal to the first direction;
 a second electrode disposed on the first surface, the second electrode including a second extending portion extending in the second direction;
 a second piezoelectric plate including a second surface;
 a spacing that is located between the first extending portion and the second extending portion in the second direction; and
 a conductive member disposed on the second surface, the conductive member covering, in the first direction, the spacing.

11. A piezoelectric actuator comprising:
a first piezoelectric plate including a first surface;
a first electrode disposed on the first surface, the first electrode including a first extending portion extending in a second direction;
a second piezoelectric plate including a second surface;
a second electrode disposed on the second surface, the second electrode including a second extending portion extending in the second direction;
a spacing that is located between the first extending portion and the second extending portion in the second direction; and
a conductive member including a first conductive portion and a second conductive portion, the first conductive portion being disposed on the first surface, the second conductive portion being disposed on the second surface, the conductive member covering, in a first direction orthogonal to the second direction, the spacing.

* * * * *